(12) United States Patent
Cao

(10) Patent No.: US 10,770,828 B2
(45) Date of Patent: Sep. 8, 2020

(54) CHARGING GUN WITH MAGNETIC ELEMENT CONTROLLING MAGNETIC SWITCH

(71) Applicant: kUNSHAN HUIHE NEW ENERGY TECHNOLOGY CO., LTD., Jiangsu (CN)

(72) Inventor: Yongguang Cao, Jiangsu (CN)

(73) Assignee: KUNSHAN HUIHE NEW ENERGY TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 16/579,005

(22) Filed: Sep. 23, 2019

(65) Prior Publication Data

US 2020/0021056 A1    Jan. 16, 2020

Related U.S. Application Data

(63) Continuation of application No. PCT/CN2018/075897, filed on Feb. 9, 2018.

(30) Foreign Application Priority Data

Mar. 21, 2017  (CN) .......................... 2017 1 0171691
Mar. 21, 2017  (CN) .......................... 2017 1 0171693

(51) Int. Cl.
  *B60L 53/16*   (2019.01)
  *H01R 13/52*   (2006.01)
  (Continued)

(52) U.S. Cl.
  CPC .......... *H01R 13/5202* (2013.01); *B60L 53/16* (2019.02); *H01R 13/502* (2013.01);
  (Continued)

(58) Field of Classification Search
  CPC .............. H01R 13/6205; H01R 13/631; H01R 2201/26; H01R 13/665; H01R 31/065;
  (Continued)

(56) References Cited

U.S. PATENT DOCUMENTS 9,401,566 B2 *  7/2016  Boeck ..................... B60L 53/16
9,723,734 B1 *  8/2017  Nishida ................ H05K 5/0213
2011/0171850 A1 *  7/2011  Brown, II ............ H01R 13/502
                                                            439/372

FOREIGN PATENT DOCUMENTS

CN        102403616        4/2012
CN        103563183        2/2014
(Continued)

OTHER PUBLICATIONS

International Search Report for International Application PCT/CN2018/075897, dated May 10, 2018.

*Primary Examiner* — Abdullah A Riyami
*Assistant Examiner* — Justin M Kratt
(74) *Attorney, Agent, or Firm* — Burris Law, PLLC

(57) ABSTRACT

A charging gun includes a housing provided with a receiving cavity, a latching member movably assembled at a periphery of the housing, a circuit module mounted in the receiving cavity, and a waterproof and air-permeable assembly. The circuit module includes a magnetic switch. A mounting recess into which the latching member is mounted is provided at the periphery of the housing, and the latching member is rotatable about a rotation shaft in the mounting recess. The latching member is provided with a magnetic element, a state of the magnetic switch is controlled by a change of a relative distance between the magnetic element and the magnetic switch with rotation of the latching member. A mounting hole communicating with the receiving cavity is provided in a bottom surface of the mounting (Continued)

recess. The waterproof and air-permeable assembly is mounted in the mounting hole to discharge heat in the receiving cavity.

15 Claims, 4 Drawing Sheets

(51) Int. Cl.
    *H02J 7/00*         (2006.01)
    *H01R 13/502*    (2006.01)
    *H01R 13/70*     (2006.01)
    *B60L 53/30*     (2019.01)
    *H01R 13/631*    (2006.01)
    *H01R 13/66*     (2006.01)
    *H01R 13/62*     (2006.01)

(52) U.S. Cl.
    CPC .......... *H01R 13/701* (2013.01); *H02J 7/0045* (2013.01); *B60L 53/30* (2019.02); *B60L 53/305* (2019.02); *B60Y 2200/91* (2013.01); *B60Y 2300/91* (2013.01); *H01R 13/6205* (2013.01); *H01R 13/631* (2013.01); *H01R 13/665* (2013.01); *H01R 2201/26* (2013.01); *Y02T 10/7088* (2013.01); *Y02T 90/12* (2013.01); *Y10S 439/95* (2013.01)

(58) Field of Classification Search
    CPC .... Y10S 439/95; Y02T 10/7088; Y02T 90/12; B60L 53/305; B60L 53/16; B60L 53/30
    USPC ............... 439/38, 39, 40, 305, 310; 320/109
    See application file for complete search history.

(56) References Cited

FOREIGN PATENT DOCUMENTS

| | | |
|---|---|---|
| CN | 106058558 | 10/2016 |
| CN | 106848731 | 6/2017 |
| CN | 106887751 | 6/2017 |
| CN | 207234031 | 4/2018 |
| JP | 6072947 | 2/2017 |

\* cited by examiner

CHARGING GUN WITH MAGNETIC ELEMENT CONTROLLING MAGNETIC SWITCH

CROSS-REFERENCE TO RELATED APPLICATIONS

This application is a continuation of International Application No. PCT/CN2018/075897, filed on Feb. 9, 2018, which claims priority to and the benefit of CN 201710171691.5, filed on Mar. 21, 2017 and CN 201710171693.4, filed Mar. 21, 2017. The disclosures of the above applications are incorporated herein by reference.

FIELD

The present disclosure relates to the field of electric vehicle charging, and more particularly, to a charging gun that is waterproof and of an easy-heat-dissipation type.

BACKGROUND

The statements in this section merely provide background information related to the present disclosure and may not constitute prior art.

An existing electric vehicle charging gun generally adopts a microswitch to cooperate with an external circuit to achieve a switch control function. When the charging gun is in a charging state, a large amount of heat will be generated, such that an internal temperature of a gun body rises above 80 degrees, which is detrimental to the service life of the charging gun or directly damages the charging gun if the heat is not dissipated in a timely manner.

The charging gun generally needs to have a waterproof design. If a fully enclosed structure is adopted, the heat will not be discharged. However, the microswitch must use physical mechanical contact pressing to achieve its function when in use, such that the physical contact of the microswitch cannot be achieved at the time of design if a fully enclosed form is adopted.

SUMMARY

The present disclosure provides a charging gun having both waterproof and heat dissipation properties.

The charging gun includes: a housing provided with a receiving cavity; a plug member inserted into a front end of the receiving cavity; a cable assembly inserted into a rear end of the receiving cavity; a latching member movably assembled at a periphery of the housing; a circuit module mounted in the receiving cavity; and a waterproof and air-permeable assembly. The circuit module is provided with a magnetic switch, a mounting recess into which the latching member is mounted is provided at the periphery of the housing, the latching member is rotatable about a rotation shaft in the mounting recess, the latching member is provided with a magnetic element, a state of the magnetic switch is controlled by a change of a relative distance between the magnetic element and the magnetic switch with rotation of the latching member, a mounting hole communicating with the receiving cavity is provided in a bottom surface of the mounting recess, and the waterproof and air-permeable assembly is mounted in the mounting hole to discharge heat in the receiving cavity.

In one form, the housing includes an outer case and a hand-held member provided on one side of the outer case, the outer case includes a front end portion and a rear end portion that include an obtuse angle therebetween, the mounting recess extends from a front end edge of the front end portion to above the hand-held member, and the rotation shaft is provided in the mounting recess.

In another form, the latching member includes a pivot hole corresponding to the rotation shaft, a latching portion extending forwardly from the pivot hole to the plug member, and a pressing portion extending backwardly from the pivot hole to above the hand-held member, the magnetic element is provided between the latching portion and the pivot hole, and the latching member achieves rotation within a certain distance by using cooperation of the pivot hole and the rotation shaft as a fulcrum.

In another form, the magnetic member and the latching member are formed into one piece or the magnetic member is mounted on the latching member, and the magnetic element is a magnet.

In yet another form, a recessed portion is provided at a position of the mounting recess corresponding to the magnetic element, and the circuit module is provided in the receiving cavity below the recessed portion.

In still another form, a step portion is provided on a periphery of an upper end surface of the mounting hole.

In another form, the waterproof and air-permeable assembly includes an upper cover, a lower cover locked with the upper cover into one piece, a waterproof ring sleeved on a periphery of the lower cover and clamped at the step portion, and a waterproof and air-permeable membrane positioned on a top of the lower cover, the lower cover includes a head portion and an elastic locking portion formed by extending downwardly from the head portion and inserted into the mounting hole, and the lower cover is up and down connected to form an air hole.

In another form, the upper cover includes a cover face body, a number of first hooks formed by extending downwardly from the cover face body, and a gap formed between the number of first hooks, the waterproof and air-permeable membrane covers the air hole of the head portion, an air chamber is formed between the cover face body and the waterproof and air-permeable membrane, and the air chamber is in communication with outside through the gap.

In yet another form, a first locking stand for locking with the number of first hooks is provided at the periphery of the head portion, the elastic locking portion includes a number of elastic tab structures, a second hook is provided at a periphery of each of the number of elastic tab structures to lock at a bottom edge of the mounting hole of the mounting recess.

In another form, the cable assembly is inserted from the rear end portion of the housing, the cable assembly includes a cable and a number of plug-connection terminals connected to the cable, the number of plug-connection terminals extend into the plug member to interface with a charging receptacle, and the plug member is inserted from the front end portion of the housing and assembled thereto.

The present disclosure further provides a charging gun, which includes: a housing provided with a receiving cavity; a plug member inserted into a front end of the receiving cavity; a cable assembly inserted into a rear end of the receiving cavity; a latching member movably assembled at a periphery of the housing; and a circuit module mounted in the receiving cavity. The circuit module is provided with a magnetic switch, a mounting recess into which the latching member is mounted is provided at the periphery of the housing, the latching member is rotatable about a rotation shaft in the mounting recess, the latching member is provided with a magnetic element, and a state of the magnetic switch is controlled by a change of a relative distance between the magnetic element and the magnetic switch with rotation of the latching member.

In one form, the housing includes an outer case and a hand-held member provided on one side of the outer case, the outer case includes a front end portion and a rear end portion that include an obtuse angle therebetween, the mounting recess extends from a front end edge of the front end portion to above the hand-held member, and the rotation shaft is provided in the mounting recess.

In another form, the latching member includes a pivot hole corresponding to the rotation shaft, a latching portion extending forwardly from the pivot hole to the plug member, and a pressing portion extending backwardly from the pivot hole to above the hand-held member.

In another form, the magnetic element is provided between the latching portion and the pivot hole, and the latching member achieves rotation within a certain distance by using cooperation of the pivot hole and the rotation shaft as a fulcrum.

In yet another form, the magnetic member and the latching member are formed into one piece or the magnetic member is mounted on the latching member, and the magnetic member is a magnet.

In another form, a recessed portion is provided at a position of the mounting recess corresponding to the magnetic element, and the circuit module is provided in the receiving cavity below the recessed portion.

In a further form, the cable assembly is inserted from the rear end portion of the housing, the cable assembly includes a cable and a number of plug-connection terminals connected to the cable, the number of plug-connection terminals extend into the plug member to interface with a charging receptacle, and the plug member is inserted from the front end portion of the housing and assembled thereto.

In another form, the circuit module includes a printed circuit board, a number of connectors and a number of resistors that are mounted on the printed circuit board, and the magnetic switch is mounted on the printed circuit board.

In another form, a mounting hole communicating with the receiving cavity is provided in a bottom surface of the mounting recess, a step portion is provided on a periphery of an upper end surface of the mounting hole, and a waterproof and air-permeable assembly is locked in the mounting hole to discharge heat in the receiving cavity.

In still another form, the waterproof and air-permeable assembly includes an upper cover, a lower cover locked with the upper cover to be formed into one piece, a waterproof ring sleeved on a periphery of the lower cover and clamped at the step portion, and a waterproof and air-permeable membrane positioned on a top of the lower cover, the lower cover includes a head portion and an elastic locking portion formed by extending downwardly from the head portion and inserted into the mounting hole, the lower cover is up and down connected to form an air hole, and the air hole exchanges heat with outside through the waterproof and air-permeable membrane.

The charging gun provides a dissipation channel for the heat in the receiving cavity to lower the temperature within the receiving cavity, while achieving waterproof performance by a waterproof and air-permeable assembly locked in the mounting hole. Moreover, the circuit module is provided with the magnetic switch and the latching member is provided with the magnetic element corresponding to the magnetic switch, such that when the latching member is pressed to rotate around the rotation shaft, the magnetic element moves with the latching member, so that a distance between the magnetic element and the magnetic switch in the receiving cavity is changed, thereby achieving a switch function. The use of such a non-physical contact switch can reduce the difficulty of waterproofing design in the receiving cavity and improve the waterproofing performance.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
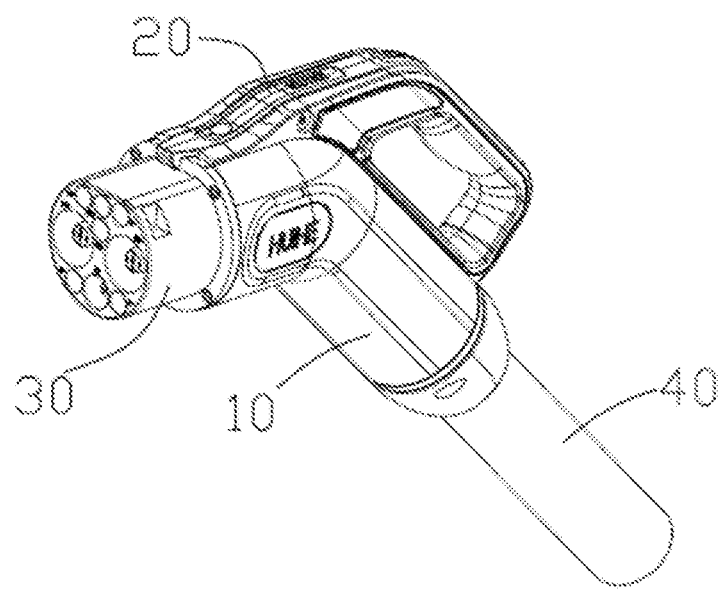
FIG. 1 is a perspective view of a charging gun according to the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure is clearly and completely described below with reference to the specific forms of the present disclosure and the corresponding drawings. It should be clear that the described forms are merely part of the forms of the present disclosure rather than all of the forms. All other forms obtained by those skilled in the art without paying creative labor shall fall into the protection scope of the present disclosure.

Figure 2:
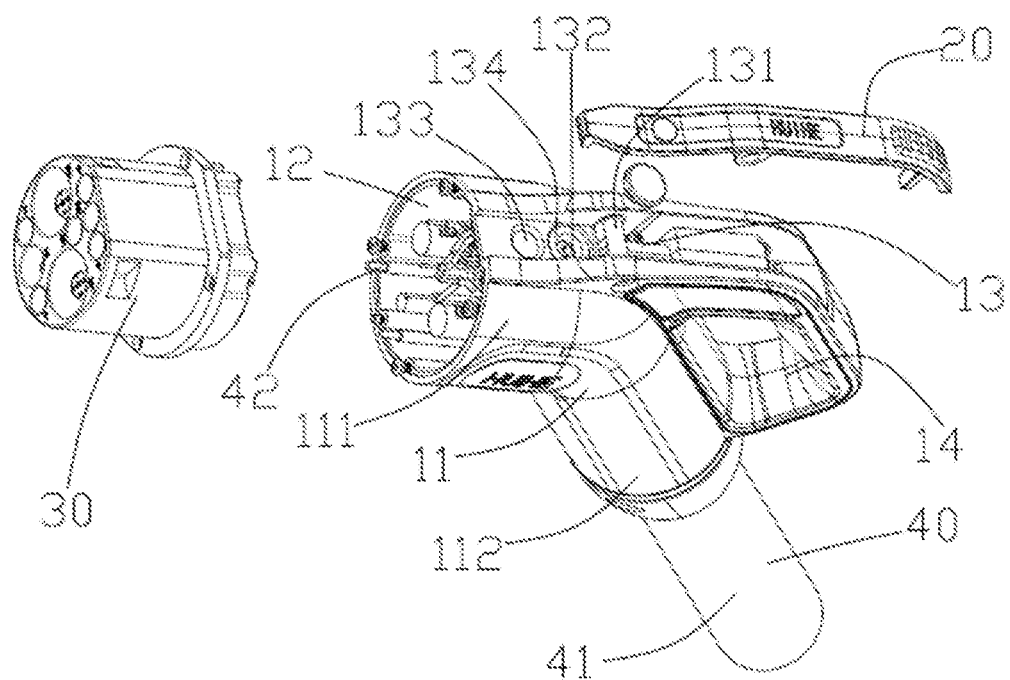
FIG. 2 is a partially exploded view of a charging gun according to the present disclosure.
Figure 3:
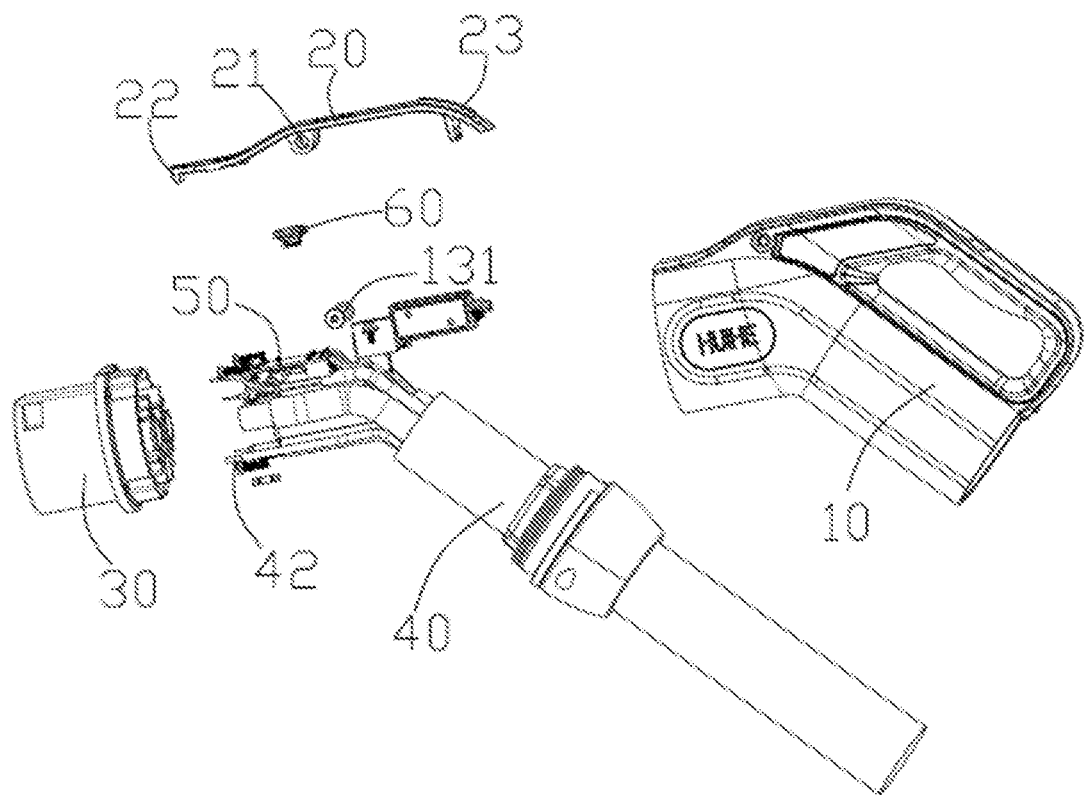
FIG. 3 is an exploded perspective view of a charging gun according to the present disclosure.

Referring to FIGS. 1 to 3, a charging gun according to the present disclosure includes a housing 10 provided with a receiving cavity 12, a plug member 30 inserted into a front end of the receiving cavity 12, a cable assembly 40 inserted into a rear end of the receiving cavity 12, a latching member 20 movably assembled on the top of the housing 10, a circuit module 50 mounted in the receiving cavity 12 and a waterproof and air-permeable assembly 60.

The housing 10 includes an outer case 11, a mounting recess 13 provided at the top of the outer case 11, and a hand-held member 14 provided at one side of the outer case. The outer case includes a front end portion 111 and a rear end portion 112, and the front end portion 111 and the rear end portion 112 that include an obtuse angle therebetween. The hand-held member 14 is provided on an outer side of the rear end portion 112. The mounting recess 13 extends from a front end edge of the front end portion 111 to above the hand-held member 14. The latching member 20 and the waterproof and air-permeable assembly 60 are mounted in the mounting recess 13. A rotation shaft 131 is provided in the middle of the mounting recess 13. A mounting hole 132 communicating with the receiving cavity 12 and a recessed portion 133 that does not communicate with the receiving cavity 12 are provided in a bottom surface of the mounting recess 13 located on a front end of the rotation shaft 131. A step portion 134 is provided at a periphery of an upper end surface of the mounting hole 132.

The cable assembly 40 is inserted from the rear end portion 112 of the housing 10 and includes a cable 41 and a number of plug-connection terminals 42 connected to the cable 41. The plug-connection terminal 42 extends into the plug member 30 to interface with a charging receptacle (not shown). The plug member 30 is inserted from the front end portion 111 of the housing 10 and assembled thereto.

Figure 5:
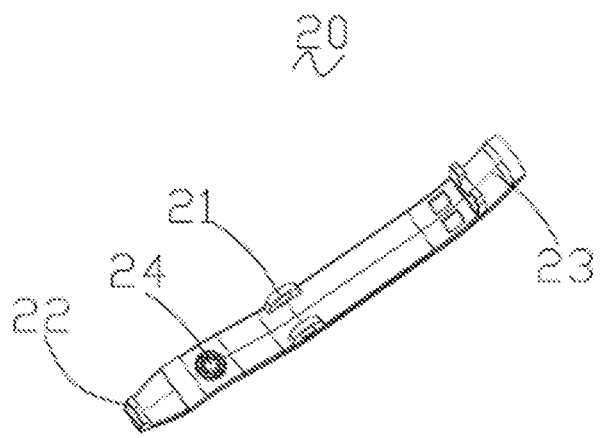
FIG. 5 is a perspective view of a latching member of a charging gun according to the present disclosure.

Referring to FIG. 5, the latching member 20 is mounted in the mounting recess 13. The latching member 20 includes a pivot hole 21 corresponding to the rotation shaft 131, a latching portion 22 extending forwardly from the pivot hole 21 to the plug member 30, a pressing portion 23 extending backwardly from the pivot hole 21 to above the hand-held member 14, and a magnetic element 24 provided between the latching portion 22 and the pivot hole 21. The magnetic element 24 and the latching member 20 are formed into one piece, or the magnetic element 24 is fixed on the latching member 20, and the magnetic element 24 can be a magnet. The magnetic element 24 corresponds to a position of the recessed portion 133 of the mounting recess 13. The latching member 20 achieves rotation within a certain distance by using the cooperation of the pivot hole 21 and the rotation shaft 131 as a fulcrum.

Figure 4:
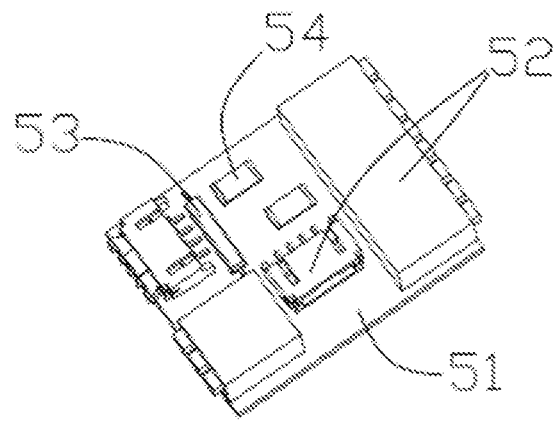
FIG. 4 is a perspective view of a circuit module of a charging gun according to the present disclosure.

Referring to FIG. 4, the circuit module 50 includes a printed circuit board 51, a number of connectors 52 mounted on the printed circuit board 51, a number of resistors 54, and a magnetic switch 53. The circuit module 50 is mounted in the receiving cavity 12 at a position corresponding to the magnetic element 24.

Figure 6:
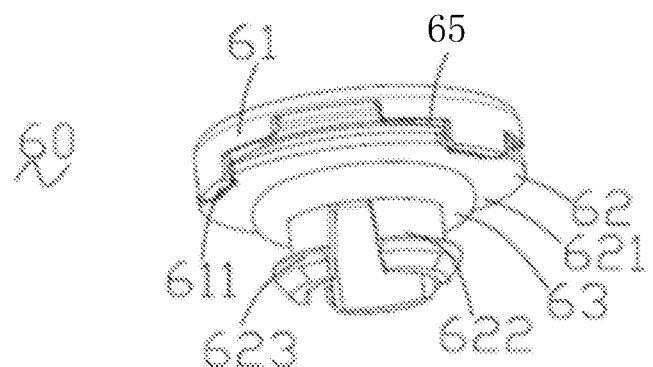
FIG. 6 is a perspective view of a waterproof and air-permeable assembly of a charging gun according to the present disclosure.
Figure 7:
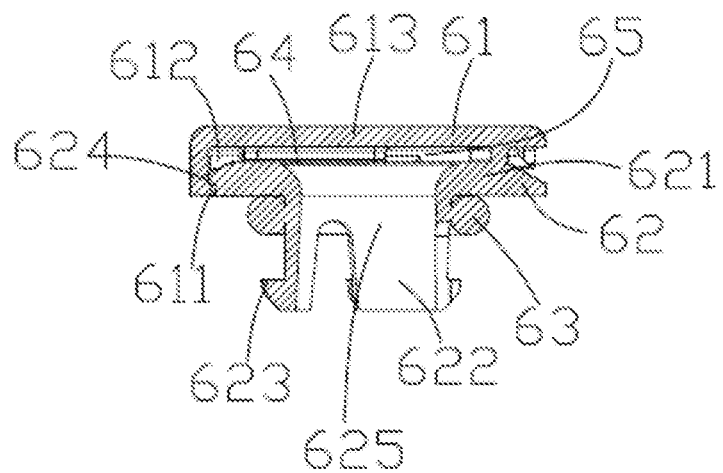
FIG. 7 is a cross-sectional view of a waterproof and air-permeable assembly of a charging gun according to the present disclosure.

Referring to FIGS. 6 and 7, the waterproof and air-permeable assembly 60 includes an upper cover 61, a lower cover 62 locked with the upper cover 61, a waterproof ring 63, and a waterproof and air-permeable membrane 64. The upper cover 61 includes a cover face body 613, a number of first hooks 611 formed by extending downwardly from the cover face body 613, and a gap 612 formed between the first hooks 611. The lower cover 62 includes a head portion 621, and an elastic locking portion 622 formed by extending downwardly from the head portion 621 and having an outer diameter smaller than that of the head portion 621. A first locking stand 624 is provided at a periphery of the head portion 621 for locking with the first hooks 611. The elastic locking portion 622 includes a number of elastic tab structures. A second hook 623 is provided at the periphery of each elastic tab structure to lock at the bottom edge of the mounting hole 132 of the mounting recess 13. The waterproof ring 63 is sleeved at a joint of the elastic locking portion 622 and the head portion 621 and is clamped at the step portion 134 on the upper edge of the mounting hole 132 to inhibit water from infiltrating. The lower cover 62 is provided with an air hole 625 penetrating through the head portion 621 and the elastic locking portion 622 in the up and down direction. The head portion of the lower cover 62 wraps the waterproof and air-permeable membrane 64 at the position of the air hole 625. The waterproof and air-permeable membrane 64 can block passage of water molecules but can allow gas to pass through. An air chamber 65 is formed between the waterproof and air-permeable membrane 64 and a lower surface of the cover face body 613 of the upper cover 61. The air chamber 65 exchanges gas and heat with an outside environment through the gap 612 at the periphery of the upper cover 61. Namely, the air chamber 65 is in communication with the gap 612. The waterproof and air-permeable membrane 64 is located below the cover face body 613, so as to inhibit dust from directly entering the waterproof and air-permeable membrane 64, which would otherwise cause a decrease in the product performance.

Figure 8:
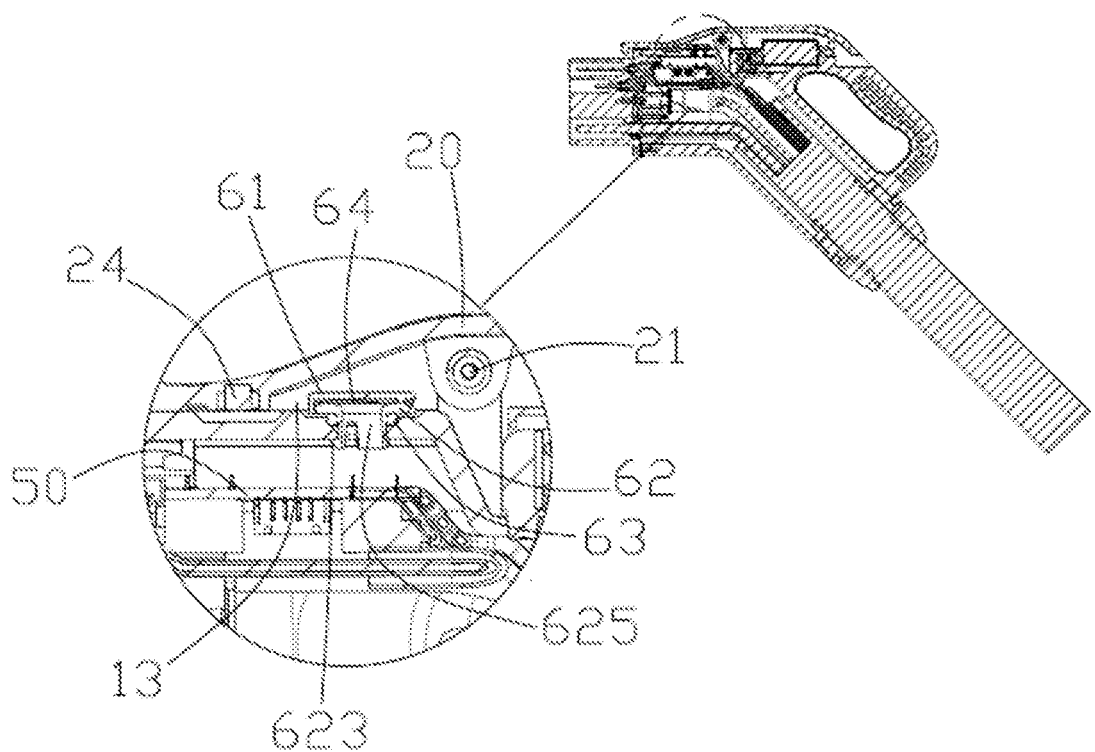
FIG. 8 is a cross-sectional view of a charging gun according to the present disclosure and a partially enlarged diagram thereof.

Referring to FIG. 8, the waterproof and air-permeable assembly 60 provides a dissipation channel for the heat in the receiving cavity 12 to lower the temperature within the receiving cavity 12, while being locked in the mounting hole 132 to achieve waterproof performance. The magnetic switch 53 is provided on the circuit module 50, and the magnetic element 24 corresponding to the magnetic switch 53 is provided on the latching member 20. When the latching member 20 is pressed to rotate the latching member 20 about the rotation shaft 131, the magnetic member 24 moves with the latching member 20, so that a distance between the magnetic member 24 and the magnetic switch 53 in the receiving cavity 12 is changed, thereby achieving a switch function. The use of such a non-physical contact switch can reduce the design difficulty of waterproofing in the receiving cavity 12 and improve the waterproof performance.

It should also be noted that the terms "including," "comprising," or any other variations thereof are intended to encompass a non-exclusive inclusion, such that the process, method, commodity, or device that include a series of elements include not only those elements, but also includes other elements that are not explicitly listed, or also include elements that are inherent to such a process, method, commodity, or device. In the absence of more restrictions, the elements defined by the statement "including one . . . " do not exclude cases in which there are additional identical elements in the process, method, commodity, or device that include the described elements.

The above description is an example of one form of the present disclosure and is not intended to limit the present disclosure. Various changes and modifications can be made to the present disclosure by those skilled in the art. Any modifications, equivalents, improvements and the like made within the scope of the present disclosure are intended to be included within the scope of the appended claims.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A charging gun, comprising:
a housing provided with a receiving cavity;
a plug member inserted into a front end of the receiving cavity;
a cable assembly inserted into a rear end of the receiving cavity;
a latching member movably assembled at a periphery of the housing;
a circuit module mounted in the receiving cavity; and
a waterproof and air-permeable assembly,
wherein the circuit module is provided with a magnetic switch, a mounting recess into which the latching member is mounted is provided at the periphery of the housing, the latching member is rotatable about a rotation shaft in the mounting recess, the latching member is provided with a magnetic element, a state of the magnetic switch is controlled by a change of a relative distance between the magnetic element and the magnetic switch with rotation of the latching member, a mounting hole communicating with the receiving cavity is provided in a bottom surface of the mounting recess, and the waterproof and air-permeable assembly is mounted in the mounting hole to discharge heat in the receiving cavity,
wherein the housing comprises an outer case and a hand-held member provided on one side of the outer case, the outer case comprises a front end portion and a rear end portion that comprise an obtuse angle therebetween, the mounting recess extends from a front end edge of the front end portion to above the hand-held member, and the rotation shaft is provided in the mounting recess, and
wherein the latching member comprises a pivot hole corresponding to the rotation shaft, a latching portion extending forwardly from the pivot hole to the plug member, and a pressing portion extending backwardly from the pivot hole to above the hand-held member, the magnetic element is provided between the latching portion and the pivot hole, and the latching member achieves rotation within a certain distance by using cooperation of the pivot hole and the rotation shaft as a fulcrum.

2. The charging gun according to claim 1, wherein the magnetic member and the latching member are formed into one piece or the magnetic member is mounted on the latching member, and the magnetic element is a magnet.

3. The charging gun according to claim 1, wherein a recessed portion is provided at a position of the mounting recess corresponding to the magnetic element, and the circuit module is provided in the receiving cavity below the recessed portion.

4. The charging gun according to claim 1, wherein a step portion is provided on a periphery of an upper end surface of the mounting hole.

5. The charging gun according to claim 4, wherein the waterproof and air-permeable assembly comprises an upper cover, a lower cover locked with the upper cover into one piece, a waterproof ring sleeved on a periphery of the lower cover and clamped at the step portion, and a waterproof and air-permeable membrane positioned on a top of the lower cover, the lower cover comprises a head portion and an elastic locking portion formed by extending downwardly from the head portion and inserted into the mounting hole, and the lower cover is up and down connected to form an air hole.

6. The charging gun according to claim 5, wherein the upper cover comprises a cover face body, a number of first hooks formed by extending downwardly from the cover face body, and a gap formed between the number of first hooks, the waterproof and air-permeable membrane covers the air hole of the head portion, an air chamber is formed between the cover face body and the waterproof and air-permeable membrane, and the air chamber is in communication with outside through the gap.

7. The charging gun according to claim 6, wherein a first locking stand for locking with the number of first hooks is provided at the periphery of the head portion, the elastic locking portion comprises a number of elastic tab structures, a second hook is provided at a periphery of each of the number of elastic tab structures to lock at a bottom edge of the mounting hole of the mounting recess.

8. The charging gun according to claim 1, wherein the cable assembly is inserted from the rear end portion of the housing, the cable assembly comprises a cable and a number of plug-connection terminals connected to the cable, the number of plug-connection terminals extend into the plug member to interface with a charging receptacle, and the plug member is inserted from the front end portion of the housing and assembled thereto.

9. A charging gun, comprising:
a housing provided with a receiving cavity;
a plug member inserted into a front end of the receiving cavity;
a cable assembly inserted into a rear end of the receiving cavity;
a latching member movably assembled at a periphery of the housing; and
a circuit module mounted in the receiving cavity,
wherein the circuit module is provided with a magnetic switch, a mounting recess into which the latching member is mounted is provided at the periphery of the housing, the latching member is rotatable about a rotation shaft in the mounting recess, the latching member is provided with a magnetic element, and a state of the magnetic switch is controlled by a change of a relative distance between the magnetic element and the magnetic switch with rotation of the latching member,
wherein the housing comprises an outer case and a hand-held member provided on one side of the outer case, the outer case comprises a front end portion and a rear end portion that comprise an obtuse angle therebetween, the mounting recess extends from a front end edge of the front end portion to above the hand-held member, and the rotation shaft is provided in the mounting recess,
wherein the latching member comprises a pivot hole corresponding to the rotation shaft, a latching portion extending forwardly from the pivot hole to the plug member, and a pressing portion extending backwardly from the pivot hole to above the hand-held member, and
wherein the magnetic element is provided between the latching portion and the pivot hole, and the latching member achieves rotation within a certain distance by using cooperation of the pivot hole and the rotation shaft as a fulcrum.

10. The charging gun according to claim 9, wherein the magnetic member and the latching member are formed into one piece or the magnetic member is mounted on the latching member, and the magnetic member is a magnet.

11. The charging gun according to claim 9, wherein a recessed portion is provided at a position of the mounting recess corresponding to the magnetic element, and the circuit module is provided in the receiving cavity below the recessed portion.

12. The charging gun according to claim 9, wherein the cable assembly is inserted from the rear end portion of the housing, the cable assembly comprises a cable and a number of plug-connection terminals connected to the cable, the number of plug-connection terminals extend into the plug member to interface with a charging receptacle, and the plug member is inserted from the front end portion of the housing and assembled thereto.

13. The charging gun according to claim 9, wherein the circuit module comprises a printed circuit board, a number of connectors and a number of resistors that are mounted on the printed circuit board, and the magnetic switch is mounted on the printed circuit board.

14. The charging gun according to claim 9, wherein a mounting hole communicating with the receiving cavity is provided in a bottom surface of the mounting recess, a step portion is provided on a periphery of an upper end surface of the mounting hole, and a waterproof and air-permeable assembly is locked in the mounting hole to discharge heat in the receiving cavity.

15. The charging gun according to claim 12, wherein the waterproof and air-permeable assembly comprises an upper cover, a lower cover locked with the upper cover to be formed into one piece, a waterproof ring sleeved on a periphery of the lower cover and clamped at the step portion, and a waterproof and air-permeable membrane positioned on a top of the lower cover, the lower cover comprises a head portion and an elastic locking portion formed by extending downwardly from the head portion and inserted into the mounting hole, the lower cover is up and down connected to form an air hole, and the air hole exchanges heat with outside through the waterproof and air-permeable membrane.

* * * * *